US006163483A

United States Patent [19]

Pasotti et al.

[11] Patent Number: 6,163,483

[45] Date of Patent: Dec. 19, 2000

[54] CIRCUIT FOR PARALLEL PROGRAMMING NONVOLATILE MEMORY CELLS, WITH ADJUSTABLE PROGRAMMING SPEED

[75] Inventors: Marco Pasotti, S. Martino Siccomario; Roberto Canegallo, Tortona; Giovanni Guaitini, Trecella; Pier Luigi Rolandi, Monleale, all of Italy

[73] Assignee: STMicroelectronics S.r.l., Agrate Brianza, Italy

[21] Appl. No.: 09/447,531

[22] Filed: Nov. 23, 1999

[30] Foreign Application Priority Data

Nov. 24, 1998 [IT] Italy .................................. TO98A0920

[51] Int. Cl.[7] ....................................................... G11C 7/00

[52] U.S. Cl. ................................ 365/185.19; 365/189.09; 365/185.23

[58] Field of Search ......................... 365/185.23, 185.19, 365/189.09, 230.06

[56] References Cited

U.S. PATENT DOCUMENTS 5,790,459 8/1998 Roohparvar ........................ 365/185.21

5,914,896 6/1999 Lee et al. ............................ 365/185.19

*Primary Examiner*—Vu A. Le

*Attorney, Agent, or Firm*—Theodore E. Galanthay; E. Russell Tarleton; Seed IP Law Group PLLC

[57] ABSTRACT

A circuit having a current mirror circuit with a first node and a second node connected, respectively, to a controllable current source and to a common node connected to the drain terminals of selected memory cells. A first operational amplifier has inputs connected to the first node and the second node, and an output connected to a control terminal of the selected memory cells and forming the circuit output. A second operational amplifier has a first input connected to a ramp generator, a second input connected to the circuit output, and an output connected to a control input of the controllable current source. Thereby, two negative feedback loops keep the drain terminals of the selected memory cells at a voltage value sufficient for programming, and feed the control terminal of the memory cells with a ramp voltage that causes writing of the selected memory cells. The presence of a bias source between the second node and the common node enables use of the same circuit also during reading.

22 Claims, 3 Drawing Sheets

CIRCUIT FOR PARALLEL PROGRAMMING NONVOLATILE MEMORY CELLS, WITH ADJUSTABLE PROGRAMMING SPEED

TECHNICAL FIELD

The present invention refers to a circuit for parallel programming nonvolatile memory cells with adjustable programming speed.

BACKGROUND OF THE INVENTION

As is known and illustrated in FIG. 1, a flash memory array 1 comprises a plurality of cells 2 arranged on rows and columns. The gate terminals of the cells arranged on a same row are connected to a respective word line 3, and the drain terminals of the cells belonging to a same column are connected to a respective bit line 4. The word lines 3 are connected to a row decoder 5, and the bit lines 4 are connected to a column decoder 6. For reading and writing the cells 2, a control unit 7, connected with the decoders 5 and 6, transmits to the decoders address and control signals for selecting, each time, only one word line 3 and one or more bit lines 4. In this way, it is possible to access the cells 2 connected to the selected word line 3 and bit lines 4.

With known programming devices, the cells are programmed by applying to the gate terminals of the selected cells 2 a discrete ramp voltage comprising a series of voltage pulses having a constant preset duration and an amplitude increasing with constant increment, and forcing a high voltage on the drain terminals of the cells 2 (write phase). In these conditions, hot electrons are injected, thereby modifying the threshold voltages $V_{th}$ of the selected cells 2. In particular, calling $\Delta\tau$ the duration of each pulse and $\Delta V$ the increment between two successive pulses, the mean slope of the ramp is $m=\Delta V/\Delta\tau$.

At equilibrium, the threshold voltage $V_{th}$ of the cell 2 being programmed increases with a slope equal to the mean slope m, and it is therefore possible to calculate the number of voltage pulses to be applied to the gate terminals of the cells 2 to be programmed to obtain the desired threshold voltage increment. Since, however, hot electron injection is, by its very nature, non-controlled and non-repeatable, at the end of each series of voltage pulses it is necessary to read the reached threshold voltages (verify phase).

Known programming devices have some drawbacks, mainly because the generation of the discrete ramp voltage requires special, quite complex devices. Generally, programming circuits for nonvolatile memory cells use for this purpose an analog/digital power converter (DAC) that must be able to drive the parasitic capacitances associated to the gate terminals of the memory cells 2 to be programmed. In addition, if the duration $\Delta\tau$ chosen for the voltage pulses is lower than the clock period $\Delta T$ of the DAC, each pulse has a dead time of duration $\Delta T-\Delta\tau$.

SUMMARY OF THE INVENTION

An embodiment of the present invention provides a device for parallel programming nonvolatile memory cells that is free from the described drawbacks.

BRIEF DESCRIPTION OF THE DRAWINGS

For a better understanding of the invention, an embodiment thereof is now described, as a non-limiting example and with reference to the attached drawings, wherein.

DETAILED DESCRIPTION OF THE INVENTION

Figure 1:
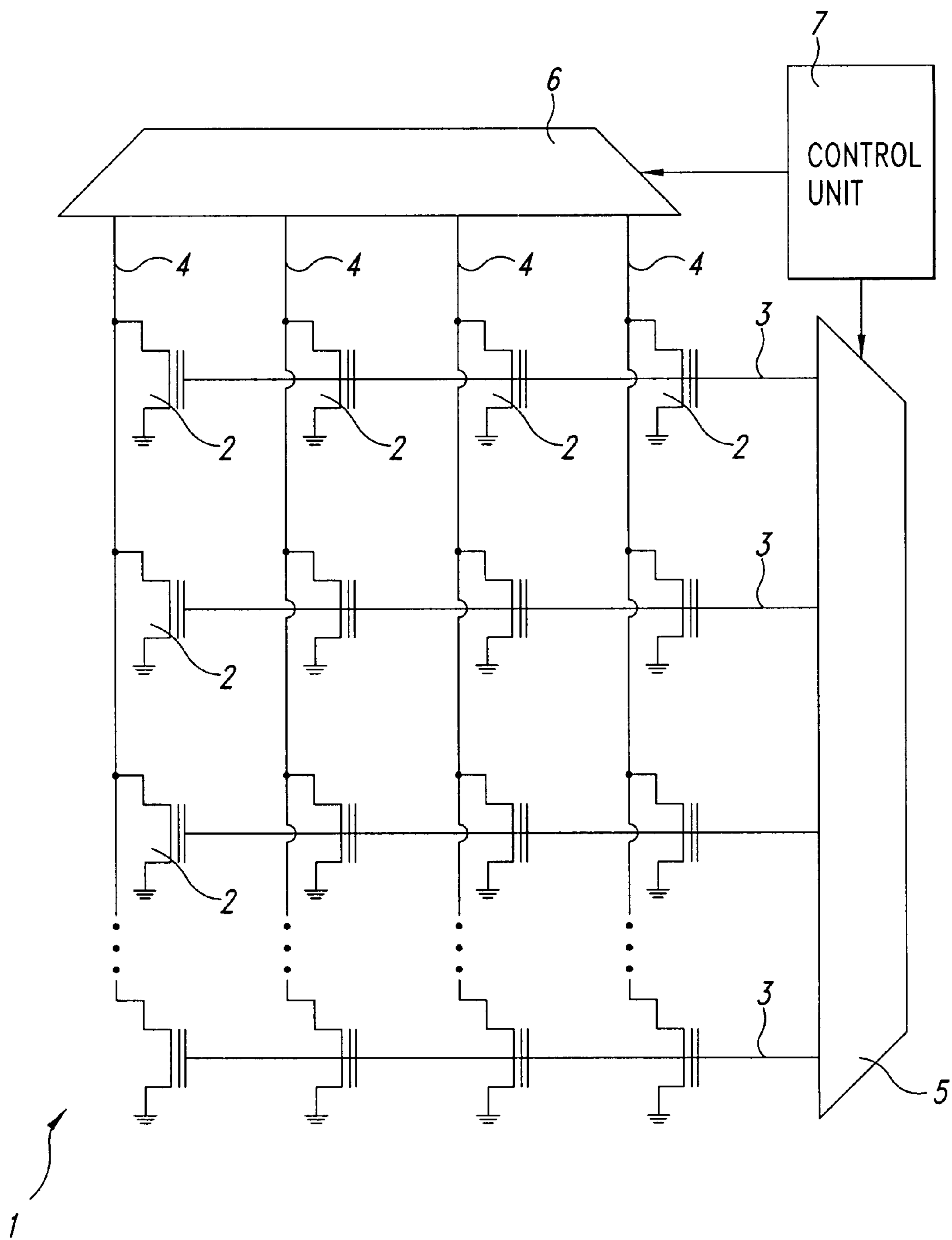
FIG. 1 illustrates a simplified circuit diagram of a flash analog memory array of known type.
Figure 2:
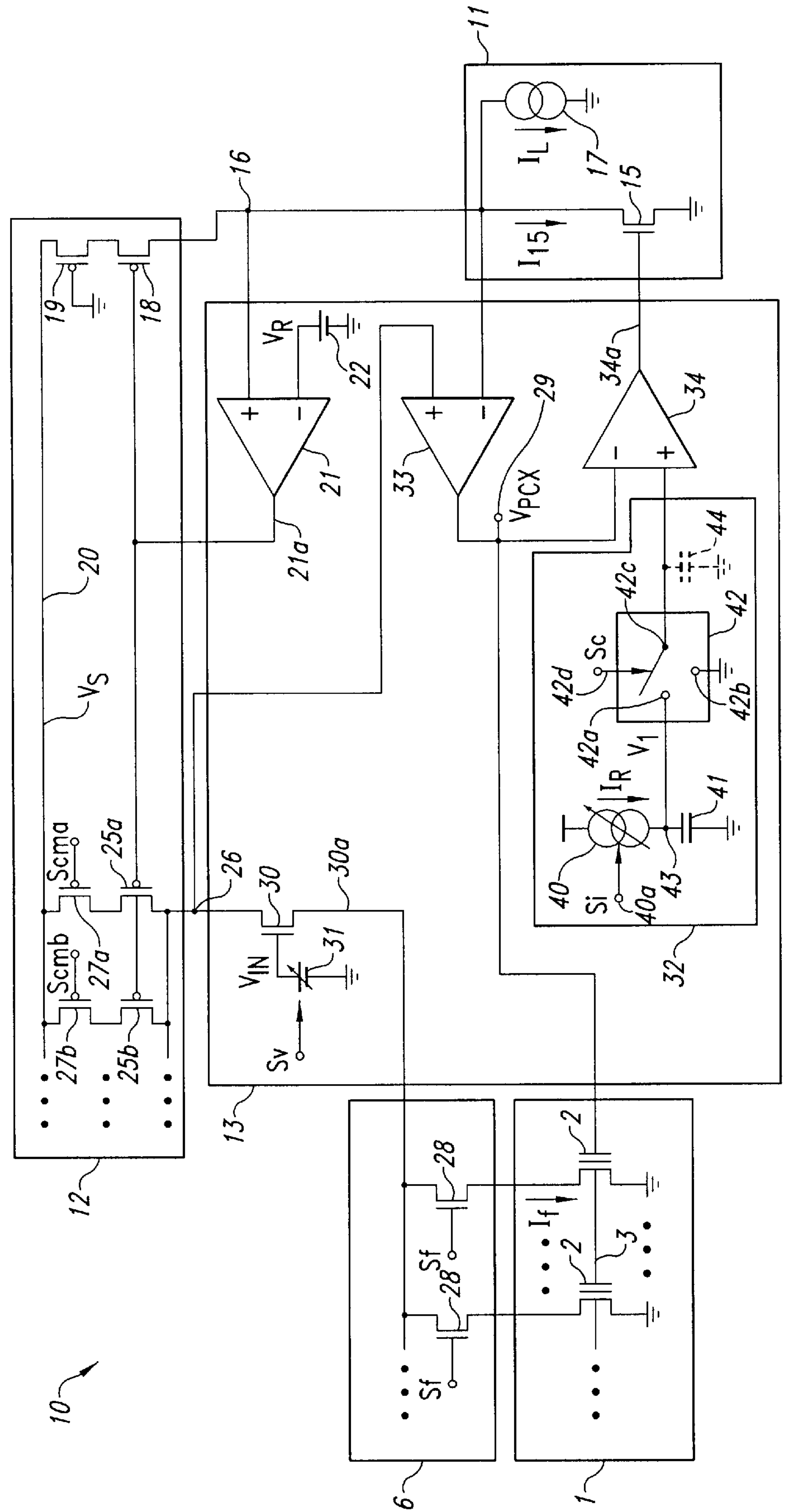
FIG. 2 illustrates a simplified circuit diagram of a parallel reading and programming circuit, according to the present invention.

As shown in FIG. 2, a circuit for parallel reading and programming nonvolatile memory cells 10 (hereinafter, for simplicity, referred to as R/W circuit 10) belonging to an integrated device, typically a memory, comprises a current generating circuit 11, a current mirror circuit 12, and a bias circuit 13, connected by the column decoder 6 and the row decoder 5 (shown in FIG. 1) to the memory array 1, of which only two cells 2 are shown.

The current generating circuit 11 comprises a current generating transistor 15, of NMOS type, having a source terminal connected to ground and a drain terminal connected to a first node 16, that is connected to a constant current source 17 supplying a read current $I_L$, having a value of, for example, 5 $\mu$A.

The current mirror circuit 12 comprises a first load transistor 18 and second load transistors 25*a*, 25*b*, . . . , of PMOS type. In detail, the first load transistor 18 has a drain terminal connected to the first node 16 and a source terminal connected, via a dummy switch 19, to a supply line 20 supplying a supply voltage $V_s$ of, for example, 10 V. The dummy switch 19 conveniently comprises a PMOS transistor having a gate terminal connected to ground so as to be always on.

The second load transistors 25*a*, 25*b*, . . . have respective drain terminals connected to a second node 26, gate terminals connected together and to the gate terminal of the first load transistor 18, and source terminals connected to the supply line 20 through a respective selection switch 27*a*, 27*b*, . . . The number of second load transistors 25*a*, 25*b*, . . . is equal to the maximum number of memory cells 2 that can be programmed in parallel and is, for example, eight. Each selection circuit 27*a*, 27*b*, . . . comprises a PMOS transistor identical to the transistor forming the dummy switch 19 and receiving at one of its gate terminals a control signal Scma, Scmb, . . . supplied by the control unit 7 (FIG. 1), to switch on or off selectively the respective second load transistor 25*a*, 25*b*, . . .

The gate terminals of the load transistors 18, 25*a*, 25*b*, . . . are connected to an output 21*a* of a first operational amplifier 21 belonging to the bias circuit 13. In detail, the first operational amplifier 21 has a non-inverting input connected to the first node 16 and an inverting input connected to a constant voltage source 22 supplying a reference voltage $V_R$ of, for example, 5 V.

The bias circuit 13 further comprises a bias transistor 30, a ramp generator stage 32, a second operational amplifier 33, and a third operational amplifier 34. The first operational amplifier 33 has an inverting input connected to the first node 16, a non-inverting input connected to the second node 26, and an output connected to the gate terminals of the memory cells 2, through a node defining the output node 29 of the R/W circuit 10 and supplying a voltage $V_{PCX}$ representing the output voltage of the R/W circuit 10. The third operational amplifier 34 has an inverting input connected to the output node 29, a non-inverting input connected to the ramp generator stage 32, and an output 34*a* connected to a gate terminal of the current generating transistor 15. The first operational amplifier 33 defines a first negative feedback between the second node 26 and the output node 29, and the third operational amplifier 34 defines a second negative feedback between the output node 29 and the gate terminal of the current generating transistor 15.

The bias transistor 30 has a drain terminal connected to the second node 26 and a gate terminal connected to a programmable voltage source 31, controlled by a signal Sv fed by the control unit 7 (FIG. 1) so as to generate a voltage $V_{IN}$ that can assume, selectively, a first value, of, for example, approximately 1.4 V, and a second value, of, for example, 10 V.

The ramp generator stage 32 comprises an adjustable current source 40 connected to a third node 43, a capacitor 41, connected between the third node 43 and ground, and a two position switch 42. Specifically, the capacitor 41 has a capacitance $C_R$ of, for example, 10 pF, and the adjustable current source 40 receives, on one of its inputs 40*a*, an adjustment signal Si, so as to supply a preset current value from a plurality of selectable values ranging, for example, from 5 $\mu$A to 300 $\mu$A.

The two position switch 42 has a first input terminal 42*a* connected to the third node 43, a second input 42*b* connected to ground, and an output 42*c* connected to the non-inverting input of the third operational amplifier 34. The two position switch, moreover, receives, at one of its control inputs 42*d*, a switching signal Sc generated by the control unit 7 to connect the output 42*c* alternatively to the first input 42*a* or to the second input 42*b*.

FIG. 2 further shows, inside the ramp generator stage 32, the parasitic capacitance $C_p$ associated to the non-inverting input of the third operational amplifier 34, represented with dashed lines as capacitor 44.

In addition, the connection of the memory cells 2 to the R/W circuit 10, which is per se known, is illustrated, for convenience, only in a simplified way. In particular, as already indicated, the row decoder 5 is not shown, and the output of the second operational amplifier 33 is directly connected to a word line 3. Furthermore, of the column decoder 6 there are shown only column address transistors 28 which each have a drain terminal connected to the source terminal 30*a* of the bias transistor 30 and which receive, on their respective gate terminals, respective address signals Sf to select one or more memory cells 2 through the respective bit line 4 (not shown), in a per se known manner.

During reading, only one memory cell 2 is selected by the address signals Sf, and only one second load transistor 25*a*, 25*b*, . . . is connected to the supply line 20 through the respective selection switch 27*a*, 27*b*, . . . controlled by the signal Scma, Scmb, . . .

In addition, the programmable voltage source 31 assumes, under control of the control unit 7 (FIG. 1), the first value of the voltage $V_{IN}$ (for example, 1.4 V), so as to bias the drain terminal of the selected memory cell 2 at a preset read value, in a per se known manner.

Furthermore, the switch 42, under control of the switching signal Sc, connects the output 42*c* to the second input 42*b*. In this way, the third operational amplifier 34 has a non-inverting input connected to ground and behaves as a comparator; in particular, since the output voltage $V_{PCX}$ is always positive, the output 34*a* of the third operational amplifier 34 is low and keeps the current generating transistor 15 off.

The current flowing in the current generating circuit 11 is, therefore, equal to the current $I_L$ set by the current source 17 (for instance, 5 $\mu$A), and the current mirror circuit 12 forces an equal current value in the bias transistor 30 and in the selected memory cell 2.

In particular, the current $I_f$ flowing in the selected memory cell 2 is given, as known, by the following expression:

$$I_f = K_f(W/L)_f[(V_{PCX}-V_{thf})-V_{DSf}/2]V_{DSf} \tag{1}$$

where:

$K_f$ is a constant linked to the cell fabrication process, $(W/L)_f$ is the dimensional width/length ratio, $V_{thf}$ is the threshold voltage, $V_{Dsf}$ is the drain-to-source voltage drop, and the term $(V_{PCX}-V_{thf})$ is the overdrive voltage of the memory cell 2.

In the imposed bias conditions, the term $V_{DSf}/2$ is negligible as compared to the term $(V_{PCX}-V_{thf})$, and Eq. (1) reduces to $$I_f = K_f(W/L)_f(V_{PCX}-V_{thf})V_{DSf} \tag{2}$$

In addition, the bias transistor 30 is saturated and, consequently, the current $I_{30}$ flowing through it is given by the following expression:

$$I_{30} = \tfrac{1}{2}K_{30}\,(W/L)_{30}(V_{GS30}-V_{th30})^2 \tag{3}$$

In Eq. (3), apart from the subscripts, the symbols have the already explained meaning, and $V_{GS30}$ is the gate-to-source voltage drop of the bias transistor 30.

Since the current $I_{30}$ is equal to $I_L$, it is constant. In addition, from Eq. (3), voltage $V_{GS30}$ is $$V_{GS30} = V_{th30} + \sqrt{\frac{2I_{30}}{K_{30}(W/L)_{30}}} \tag{4}$$

and thus is constant.

Consequently, the voltage on the source terminal of the cell 2, the value whereof is given by the following equation:

$$V_{S30} = V_{IN} - V_{GS30} \tag{5}$$

is constant, as is the drain-to-source voltage drop $V_{DSf}$ of the cell 2, which is equal to $V_{S30}$, except for the (negligible) voltage drop on the address transistor 28, which is at that moment on.

The output voltage $V_{PCX}$ is linearly dependent upon the threshold voltage $V_{thf}$ of the memory cell 2. In fact, from Eq.(2), the following equation is obtained:

$$V_{PCX} = V_{thf} + \frac{I_f}{K_f(W/L)_f V_{DSf}} \tag{6}$$

wherein the second addendum is constant, according to the above. Reading of the output voltage $V_{PCX}$ thus yields the threshold value sought, except for a constant.

During programming, the address signals Sf select a plurality of cells 2 belonging to the same word line 3, and the selection signals Scma, Scmb, . . . , switch on a number of second load transistors 25*a*, 25*b*, . . . equal to the number of selected memory cells 2. Typically, eight memory cells 2 are selected.

The control signal Sv selects the second voltage value $V_{IN}$ of the programmable voltage source 31 (e.g., 10 V), which, consequently, behaves as a closed switch; in addition the switching signal Sc causes the output 42*c* of the two position switch 42 to be connected to the first input 42*a*.

In this way, the non-inverting input of the third operational amplifier 34 is connected to the third node 43. In addition, the adjustable current source 40 is activated by the adjustment signal Si and supplies the current $I_R$, of, for example 10 μA. Consequently, a voltage V1 on the third node 43 increases linearly with a slope $P=I_R/(C_R+C_P)$, where $C_R$ is the capacitance of the capacitor 41, and $C_P$ is the parasitic capacitance associated to the non-inverting input of the third operational amplifier 34, as indicated above.

The current source 17, in this phase, is preferably off and, consequently, the current flowing in the current generating circuit 11 is set only by the current generating transistor 15.

By virtue of the first operational amplifier 21, and, respectively, of the second operational amplifier 33, a voltage value equal to $V_R$ (for example, 5 V) is forced on nodes 16 and 26. Since the voltage drop on the bias transistor 30 and on the selected selection switches 28 is negligible, the drain terminals of the memory cells 2 connected to them are at a voltage value close to $V_R$. Consequently, in the selected memory cells 2, hot electrons are generated for writing the memory cells 2.

The third operational amplifier 34 forces its own inverting input (and hence the output node 29) so as to follow the ramp voltage at its non-inverting input; consequently, the output voltage $V_{PCX}$ becomes equal to V1 and also increases linearly with slope P. At the same time, the second operational amplifier 33 supplies the current necessary for charging the capacitances associated to the gate terminals of the selected memory cells 2.

In addition, the output 34*a* of the third operational amplifier 34 drives the current generating transistor 15, so that the latter may supply the writing current. In particular, the current generating transistor 15 forces, in the current generating circuit, a current $I_{15}$ which is mirrored by the selected second load transistors 25*a*, 25*b*, . . . In this way, the current mirror circuit 12 supplies, at the second node 26, a current equal to the value of $I_{15}$ multiplied by the number of selected second load transistors 25*a*, 25*b*, . . . , i.e., equal to the number of cells 2 to be written.

Figure 3:
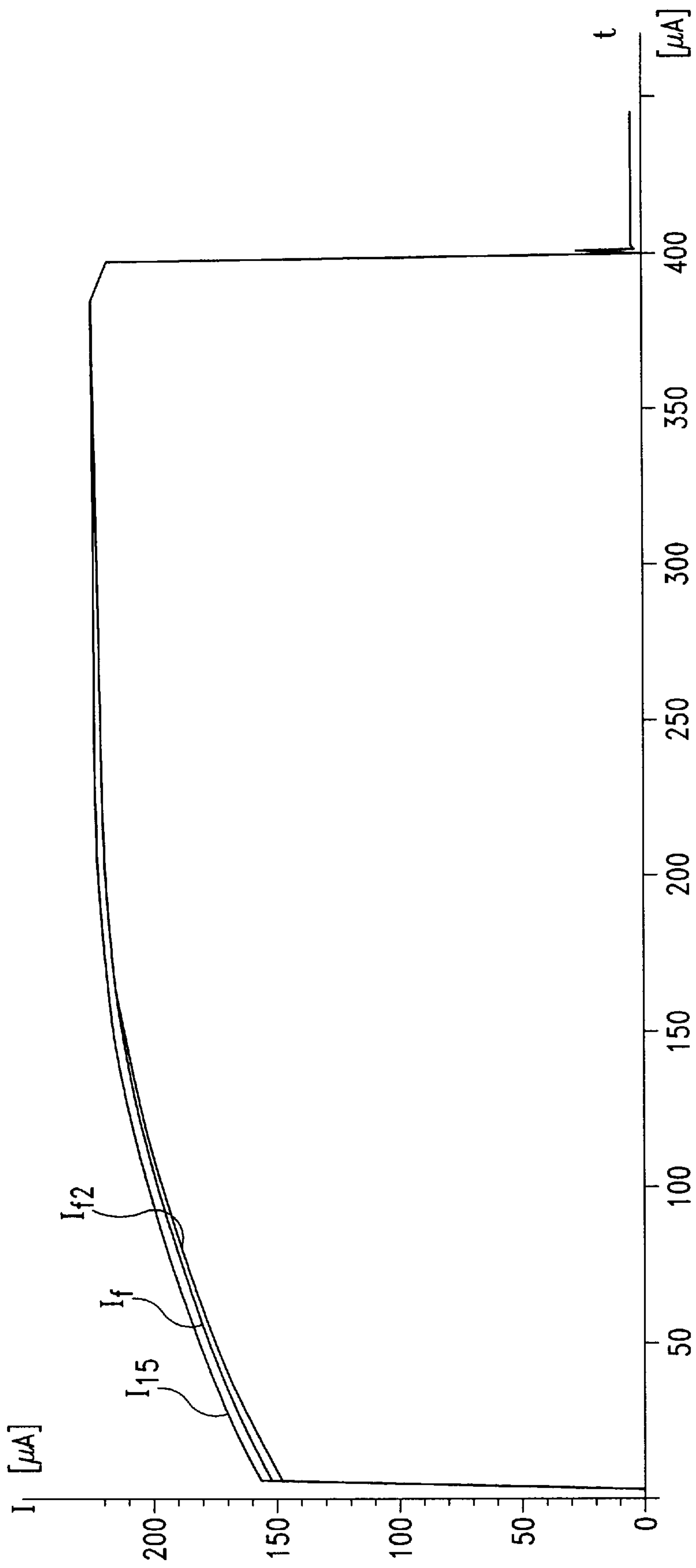
FIG. 3 is a plot of currents flowing in the device of FIG. 2.

In an initial programming phase, the selected memory cells 2 have threshold values different from one another and consequently, for a same gate-to-source voltage, absorb different currents. However, the difference between the current absorbed by the different cells tends to automatically compensate. In fact, according to Eq. (1), the memory cells which initially have lower threshold voltages, have higher overdrive voltages ($V_{PCX}-V_{thf}$) and absorb higher currents; consequently, their threshold voltages undergo more rapid increments. Once they reach a steady state condition, the selected memory cells 2 absorb approximately equal currents and, in particular, equal to $I_{15}$. As an example, FIG. 3 shows, as a function of time, the currents $I_{f1}$ and $I_{f2}$ absorbed by two memory cells 2 having initially different threshold voltages, as well as the current $I_{15}$.

In addition, in the steady state condition, the current $I_{15}$ and the currents absorbed by the memory cells 2 are constant and, hence, in the described conditions, the threshold voltages of all the selected memory cells 2 vary linearly with a slope equal to the slope P of the output voltage $V_{PCX}$. In particular, as indicated in C. Calligaro, A. Manstretta, A. Modelli, G. Torelli, "Technological and design constraints for multilevel flash memories", Proceedings of International Conference on Electronic Circuits and Systems, Rodes, Greece, pp. 1003–1008, for all the selected memory cells 2 it is found that $$\Delta V_{thf}=\Delta V_{PCX} \quad (7)$$

where $\Delta V_{thf}$ is the threshold voltage variation of the individual memory cells 2, and $\Delta V_{PCX}$ is the voltage variation of the output node 29.

Parallel programming of the memory cells 2 can be carried out as described hereinbelow.

Initially, a group of memory cells 2 is selected, and the R/W circuit 10 is biased for writing for a time interval $T_0$, which is necessary for the circuit to reach the steady state condition and is determined experimentally.

Subsequently, the R/W circuit 10 is brought to the verify read configuration. In detail, the voltage $V_{IN}$ generated by the programmable voltage source 31 assumes the first voltage value (1.4 V), the output 42*c* of the two-position switch 42 is kept connected to the second input 42*a*, the adjustable current source 40 is switched off, and the constant current source 17 is switched on. Consequently, the capacitor 41 is floating, so that the voltage on the third node 43 remains substantially constant. In the described conditions, the output voltage $V_{PCX}$ is read on the output node 29 and, according to the read voltage value and the desired minimum output voltage value (corresponding to the minimum threshold voltage value to be programmed), the necessary voltage difference ΔV is calculated. Consequently, knowing the value of the slope P of the voltage ramp V1, the write time $T_W=\Delta V/P$ can be calculated, which is the time necessary for reaching the desired minimum output voltage value.

The R/W circuit 10 is then brought to the write configuration, according to the procedure described above, for a time equal to $T_W$, at the end of which a new verify read operation is carried out of the output voltage $V_{PCX}$. If the read value is lower than the lowest desired value, a new write time $T_W$ is calculated, and a further write phase is carried out. If, instead, the output voltage value $V_{PCX}$ read is equal to the desired lowest value, the memory cells 2 to be programmed at the lowest threshold level are deselected via the respective column address transistors 28, and a corresponding number of second load transistors 25*a*, 25*b*, . . . is switched off.

Then the memory cells 2 that have remained selected are written to a desired output voltage value that is immediately higher than the lowest desired value, thereafter the cells 2 that have reached the second desired threshold voltage are deselected. Next, the write and verify cycles are repeated for all the voltage values to be programmed, until programming of all the memory cells 2 is completed.

The described R/W circuit 10 has the following advantages.

First, the interaction between the ramp generator stage 32, the second operational amplifier 33, supplying the current required for charging the capacitances associated to the gate terminals of the memory cells 2, and the third operational amplifier 34 eliminates the need of the power DAC previously necessary for generating a discrete ramp voltage, with consequent reduction in the overall dimensions of the RIW circuit 10.

In addition, the voltage supplied by the ramp generator stage 32 varies continuously over time, and its slope can be set easily before start of programming by varying the current supplied by the adjustable current source 40. Consequently, the dead times associated to the use of a DAC are eliminated, and the R/W circuit 10 is thus rendered faster.

The current mirror circuit 12 enables optimization of current consumption. In fact, the first load transistor 18 always supplies (once it has settled to a steady state condition) a same current value, independently of the number of memory cells to be programmed, and the higher current required for parallel programming a larger number of memory cells 2 is obtained by switching on a corresponding number of second load transistors 25*a*, 25*b*, . . . , according to the specific requirements. The circuit 12 thus forms a programmable current mirror. If, instead, a traditional current mirror is used, the output node whereof (second node 26) supplies a current equal to the current flowing in the input node (first node 16), the circuit branch comprising the current generating transistor 15 has a consumption equal to the one required by all the memory cells 2 selected at that moment, hence a decidedly higher consumption.

The R/W circuit 10 carries out both reading and writing, thus simplifying the device in which it is inserted, reducing the total overall dimensions, and optimizing the writing time.

Finally, it is evident that modifications and variants can be made to the R/W circuit 10 described, without departing from the scope of the present invention.

For example, the ramp generator stage 32 can have a circuit topology different from the one described. In addition, the first load transistor 18 and the second load transistors 25*a*, 25*b*, . . . can have either the same dimensions or different dimensions. In particular, the first load transistor 18 can be smaller than the second load transistors 25*a*, 25*b*, . . . , thus reducing the current flowing in the current generating circuit 11, and, consequently, the consumption of the R/W circuit 10.

In addition, the first load transistor 18 and the second load transistor 25*a*, 25*b*, . . . can be replaced by NMOS transistors, and the inputs of the first operational amplifier 21 can be mutually inverted.

It is to be understood that while various changes can be made to the embodiments described herein, the invention is to be limited only by the scope of the claims that follow.

We claim:

1. A circuit for parallel programming nonvolatile memory cells having respective first terminals selectively connected together and to a common node and respective control terminals, the circuit comprising:

- a current mirror circuit having a first node and a second node, said second node being connected to said common node;
- an adjustable current generating circuit connected to said first node and having a control terminal; and
- a bias circuit including first negative feedback means and ramp generator means selectively activated; said first negative feedback means having a first input connected to said first node, a second input connected to said second node, and an output connected to said control terminals of said memory cells and forming a circuit output, and said ramp generator means connected to said control terminals of said memory cells; said bias circuit further comprises second negative feedback means having a first input, a second input, and an output; said first input of said second negative feedback means connected to said ramp generator means, said second input of said second negative feedback means connected to said control terminals of said memory cells, and said output of said second negative feedback means connected to said control terminal of said current generating circuit.

2. The circuit of claim 1 wherein said current mirror circuit is programmable and feeds said second node with a current correlated to the number of selected memory cells.

3. The circuit of claim 2 wherein said current mirror circuit comprises a first load transistor connected between a first reference potential line and said first node, and a plurality of second load transistors connected between said first reference potential line and said second node and selectively activated; said first and second load transistors having control terminals connected together.

4. The circuit of claim 3, further comprising a plurality of selection switches, each connected between said first reference potential line 20 and a respective second load transistor.

5. The circuit of claim 4 wherein said selection switches each comprise a MOS transistor having a control terminal receiving a respective control signal.

6. The circuit of claim 3 wherein said bias circuit further comprises voltage source means connected to said second node.

7. The circuit of claim 6 wherein said voltage source means comprises a first operational amplifier having a first input connected to a constant voltage source, a second input connected to said first node, and an output connected to said control terminals of said first load transistor and second load transistors.

8. The circuit of claim 1 wherein said current generating circuit comprises a current source transistor having a first terminal and a second terminal connected between said first node and a second reference potential line, and a control terminal connected to said output of said second negative feedback means.

9. The circuit of claim 1 wherein said ramp generator means comprises a programmable current source and a capacitive element connected together at a third node, said third node being connected to said first input of said second feedback means.

10. The circuit of claim 1 wherein said first and second negative feedback means comprises a second operational amplifier and a third operational amplifier, said second operational amplifier having an inverting input connected to said first node, and a non-inverting input connected to said second node, said third operational amplifier having an inverting input connected to said circuit output and a non-inverting input connected to said ramp generator means.

11. The circuit of claim 1, further comprising read/write control means for said memory cell.

12. The circuit of claim 11 wherein said read/write control means comprises bias means connected between said second node and said common node, said bias means switching between a first working condition, wherein said bias means keeps said common node at a preset voltage, and a second working condition, wherein said bias means keeps said common node at a voltage close to a voltage of said second node; in that said current generating circuit switches between a first working condition, wherein said current generating circuit generates a first current, and a second working condition, wherein said current generating circuit generates a second current greater than said first current.

13. The circuit of claim 12 wherein said read/write control means comprises control means simultaneously keeping said ramp generator means deactivated and said bias means in said first working condition.

14. The circuit of claim 12 wherein said bias means comprises a MOS transistor and a programmable voltage source; said MOS transistor having a first terminal and a second terminal connected, respectively, to said second node and to said common node, and a control terminal connected to said programmable voltage source.

15. A method for parallel programming nonvolatile memory cells having respective first terminals selectively connected together and to a common node and respective control terminals, comprising:

- selectively connecting first terminals of selected memory cells to said common node;
- biasing said common node at a programming voltage $V_R$;
- generating a first negative feedback between said common node and said control terminals of said selected memory cells;

generating a ramp voltage;

applying said ramp voltage to said control terminals of said selected memory cells;

enabling a controllable current source;

generating a second negative feedback between said controllable current source and said control terminals of said selected memory cells, thereby generating a programming current; and mirroring said programming current towards said common node.

16. The method of claim 15 wherein mirroring comprises feeding said common node with a cell current equal to a multiple of said programming current.

17. The method of claim 16, further comprising:

programming a first plurality of selected memory cells at a first output voltage value;

deselecting a first group of said number of selected memory cells to obtain a second plurality of selected memory cells smaller than said first plurality;

programming said second plurality of selected memory cells at a second output voltage;

deselecting a second group of said plurality of selected memory cells; and repeating said programming and deselecting steps until all said cells of said first plurality are programmed at preset output voltages.

18. A circuit for parallel programming nonvolatile memory cells, the memory cells having first terminals selectively connected together and to a common node, and respective control terminals, the circuit comprising:

a current mirror circuit with a first node and a second node connected, respectively, to a controllable current source and to the common node;

a first operational amplifier having first and second inputs respectively connected to the first node and the second node of the current mirror circuit, and an output connected to the control terminals of the memory cells and forming the circuit output; and a second operational amplifier having a first input connected to a ramp generator, a second input connected to the circuit output, and an output connected to a control input of the controllable current source.

19. The circuit of claim 18, further comprising a bias source coupled between the common node and the second node and configured to enable use of the circuit during reading of the memory cells.

20. The circuit of claim 18 wherein the first and second operational amplifiers are configured to provide negative feedback to the first terminals of the memory cells at a voltage value sufficient for programming, and to feed the control terminal of the memory cells with a ramp voltage that causes writing of the memory cells.

21. The circuit of claim 19 wherein the bias source comprises a third operational amplifier having a first input connected to a constant voltage source, a second input coupled to the first node of the current mirror circuit, and an output connected to the current mirror circuit.

22. The circuit of claim 21 wherein the current mirror circuit comprises a first load transistor connected between a first reference potential line and the first node, and a plurality of second load transistors connected between the first reference potential line and the second node and selectively activated, the first and second load transistors having control terminals connected together and to the output of the third operational amplifier.

* * * * *

UNITED STATES PATENT AND TRADEMARK OFFICE

CERTIFICATE OF CORRECTION

PATENT NO. : 6,163,483
DATED : December 19, 2000
INVENTOR(S) : Marco Pasotti et al.

It is certified that error appears in the above-identified patent and that said Letters Patent is hereby corrected as shown below:

Title page,
Item [30], Foreign Priority Application Data, should read -- TO98A 000990 --.

Signed and Sealed this

Twenty-fifth Day of May, 2004

JON W. DUDAS
*Acting Director of the United States Patent and Trademark Office*